United States Patent [19]

Young

[11] Patent Number: 4,912,419

[45] Date of Patent: Mar. 27, 1990

[54] SIGNAL CONDITIONING CIRCUIT AND METHOD

[75] Inventor: James E. Young, Harper Woods, Mich.

[73] Assignee: Ford Motor Company, Dearborn, Mich.

[21] Appl. No.: 286,906

[22] Filed: Dec. 19, 1988

[51] Int. Cl.$^4$ .............................................. G01R 23/06
[52] U.S. Cl. ........................................ 328/140; 307/519; 307/517; 377/41; 377/42
[58] Field of Search ................. 307/519, 517; 328/140; 377/41, 42

[56] References Cited

U.S. PATENT DOCUMENTS

| | | | |
|---|---|---|---|
| 2,986,698 | 5/1961 | Burklund | 324/131 |
| 2,989,701 | 6/1961 | Gill | 324/131 |
| 3,068,406 | 12/1962 | Dellinger | 324/131 |
| 3,535,658 | 10/1970 | Webb | 328/140 |
| 3,551,651 | 12/1970 | Offereins | 377/41 |
| 3,944,935 | 3/1976 | Plant | 328/140 |
| 4,085,373 | 4/1978 | McConnell | 307/519 |
| 4,197,508 | 4/1980 | Takaoka | 328/140 |
| 4,215,315 | 7/1980 | Lambert et al. | 328/140 |
| 4,322,642 | 3/1982 | Sugasawa | 307/522 |
| 4,816,704 | 3/1989 | Fiori | 328/140 |
| 4,823,060 | 4/1989 | Doemen | 328/140 |

FOREIGN PATENT DOCUMENTS 54-106276 8/1979 Japan .

OTHER PUBLICATIONS

Institution of Electrical Engineers Paper Entitled "Rapid—Response Frequency Measurement Using Analogue Period Process", vol. 11, No. 16, pp. 383-384, 8/7/75.

Primary Examiner—John S. Heyman
Attorney, Agent, or Firm—Allan J. Lippa; Peter Abolins

[57] ABSTRACT

An apparatus and method for detecting the period of a frequency signal having a period greater than a minimum period and within a period range. A clock frequency is generated such that when multiplied by the predetermined range the product is less than $2^N$ and when multiplied by the minimum period of the product is less than $2^{N+M}$. The resulting clock frequency is multiplied by the minimum period to generate an offset number. A counter is preset with the offset number in response to a detected edge transition of the frequency signal. The counter counts at the clock frequency from a complement of the offset number to a final count at a subsequent edge transition. The final count is contained within the first N bits and is related to the period of the frequency signal.

15 Claims, 4 Drawing Sheets

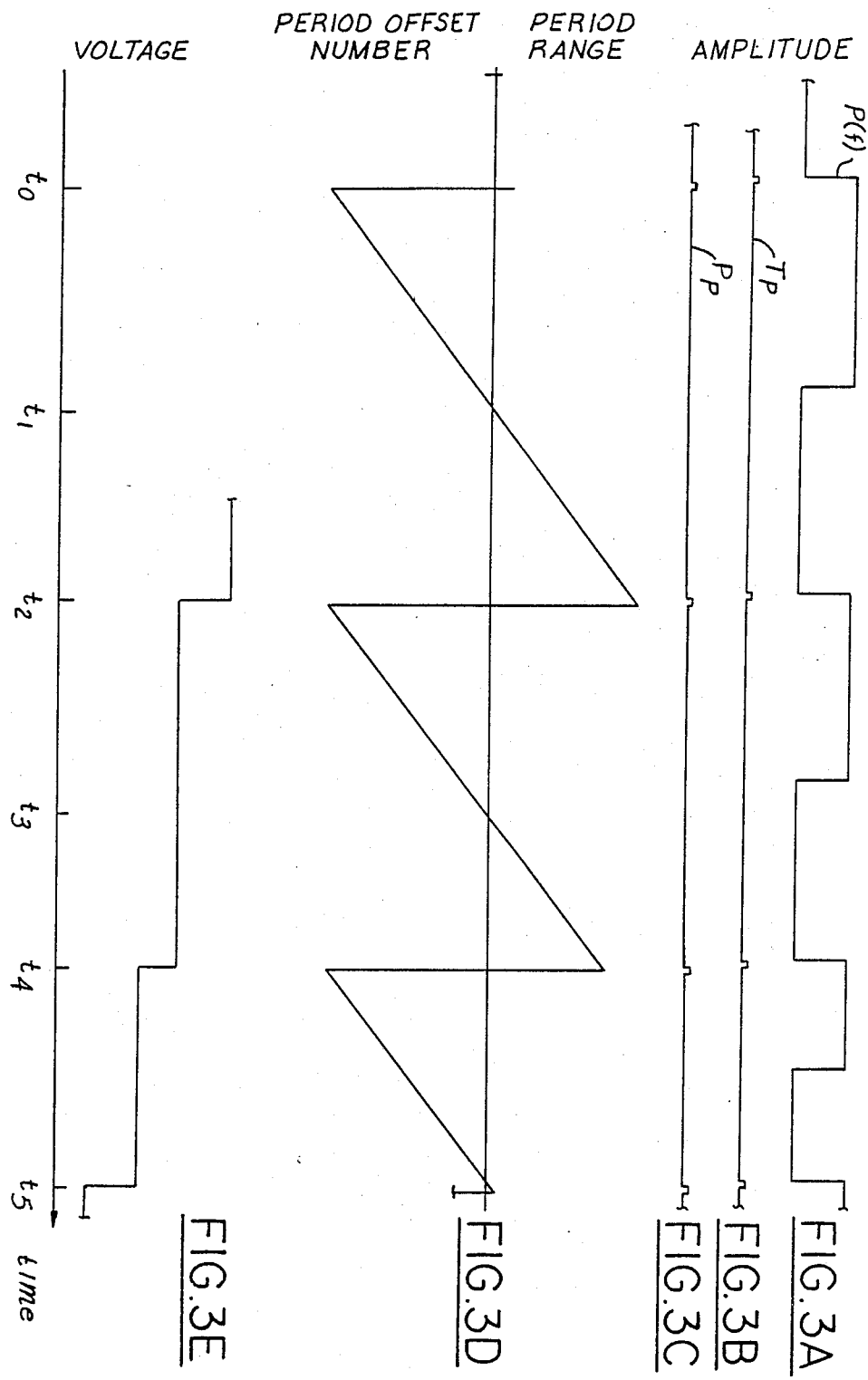

SIGNAL CONDITIONING CIRCUIT AND METHOD

BACKGROUND OF THE INVENTION

The field of the invention relates to frequency or period to amplitude conversion for producing a signal having an amplitude corresponding to the output frequency of a sensor.

In many applications, such as automobile applications in particular, sensors provide a frequency signal having a frequency related to a measured parameter. For example, a speed sensor provides a signal having a frequency related to either the vehicular speed or engine speed, a manifold pressure sensor provides a signal having a frequency related to engine manifold pressure and so on. It is necessary to convert the frequency signal into an amplitude signal for signal processing. Examples of signal processing include onboard engine control and also diagnostic testing. The amplitude value may be either a voltage related to frequency or a digital word related to frequency.

In one approach to frequency to voltage conversion, as disclosed in Japanese patent application No. 0106276, one period of a frequency signal to be measured is integrated utilizing analog integrators and timing circuits In another approach as disclosed in U.S. Pat. No. 4,197,508 issued to Takaoka, the period of one frequency signal is applied to a frequency divider and a logic circuit to control the charging and discharging of capacitors. A voltage is thereby obtained proportional to the input signal. One disadvantage of these approaches is the inaccuracy caused by temperature dependent drift of the analog devices.

Still another approach is disclosed in U.S. Pat. No. 3,944,935 issued to Plant wherein generated pulses are counted for a time proportional to input signal frequency. The counter output is applied to a digital to analog converter for generating a dc voltage signal. A feedback signal is then derived from a comparison between the dc voltage signal and a reference signal such that, allegedly, the dc signal is directly proportional to the input signal frequency.

The inventor herein has recognized a disadvantage with all known prior approaches. More specifically, the frequency signal may vary across a frequency range. Prior known approaches are designed to convert any frequency signal from zero frequency to the maximum frequency of the frequency range. Accordingly, the sensitivity to noise of these prior approaches is limited. Further, in the case of digital processing, an excessive number of data bits are required with resulting disadvantages in transferring information and subsequent digital processing.

SUMMARY OF THE INVENTION

It is an object of the invention described herein to provide period to amplitude conversion over the actual period range of a frequency signal.

The problems and disadvantages of prior approaches are overcome, and above object achieved by providing a circuit for determining a period of a frequency signal having a period both greater than a minimum period and within a period range. In one particular aspect of the invention, the circuit comprises: an edge detector for detecting edge transitions of the frequency signal in a predetermined direction; clock selection means for providing a clock signal; offset means for providing an offset signal by multiplying the minimum period by the clock signal; and counter means coupled to the edge detector and the clock selection means and being preset with a complement of the offset signal from the offset means for counting from the complement of the offset signal at the clock signal to provide a count related to the period of the frequency signal in response to the edge transitions.

In another aspect of the invention, the circuit comprises: detection means for detecting edge transitions of the frequency signal in a predetermined direction; counter means comprising a binary counter having $N+M$ bits and clocked at a clock frequency; clock selection means for providing the clock frequency such that the clock frequency times the predetermined range is less than $2^N$ and the clock frequency times the minimum period is less than $2^{N+M}$; offset means for providing an offset number related to the clock signal times the minimum period and for providing a complement of the offset number having $N+M$ bits; and the counter means being preset with the complement of the offset number in response to the edge transitions for counting from the complement of the offset number to zero and from zero to a final count at a subsequent edge transition, the final count being related to the period of the frequency signal and being contained within N bits.

By presetting the counter with a complement of the offset signal, the dynamic range of the counter is centered on the period range of the frequency signal. Accordingly, the dynamic range of the system is maximized. Stated another way, there is a maximum change in counter output for a given change in input frequency or period. An advantage is thereby obtained of having less sensitivity to noise than prior approaches. Another advantage is that the number of data bits required for a desired sensitivity is minimized thereby reducing the number of output data lines and also reducing subsequent data processing.

BRIEF DESCRIPTION OF THE DRAWINGS

The objects an advantages described herein will be more fully understood by reading the Description of the Preferred Embodiment with reference to the drawings wherein:

FIG. 3A-3E show various electrical waveforms associated with the embodiment shown in FIGS. 1A and 1B.

DESCRIPTION OF THE PREFERRED EMBODIMENT

Figure 1A:
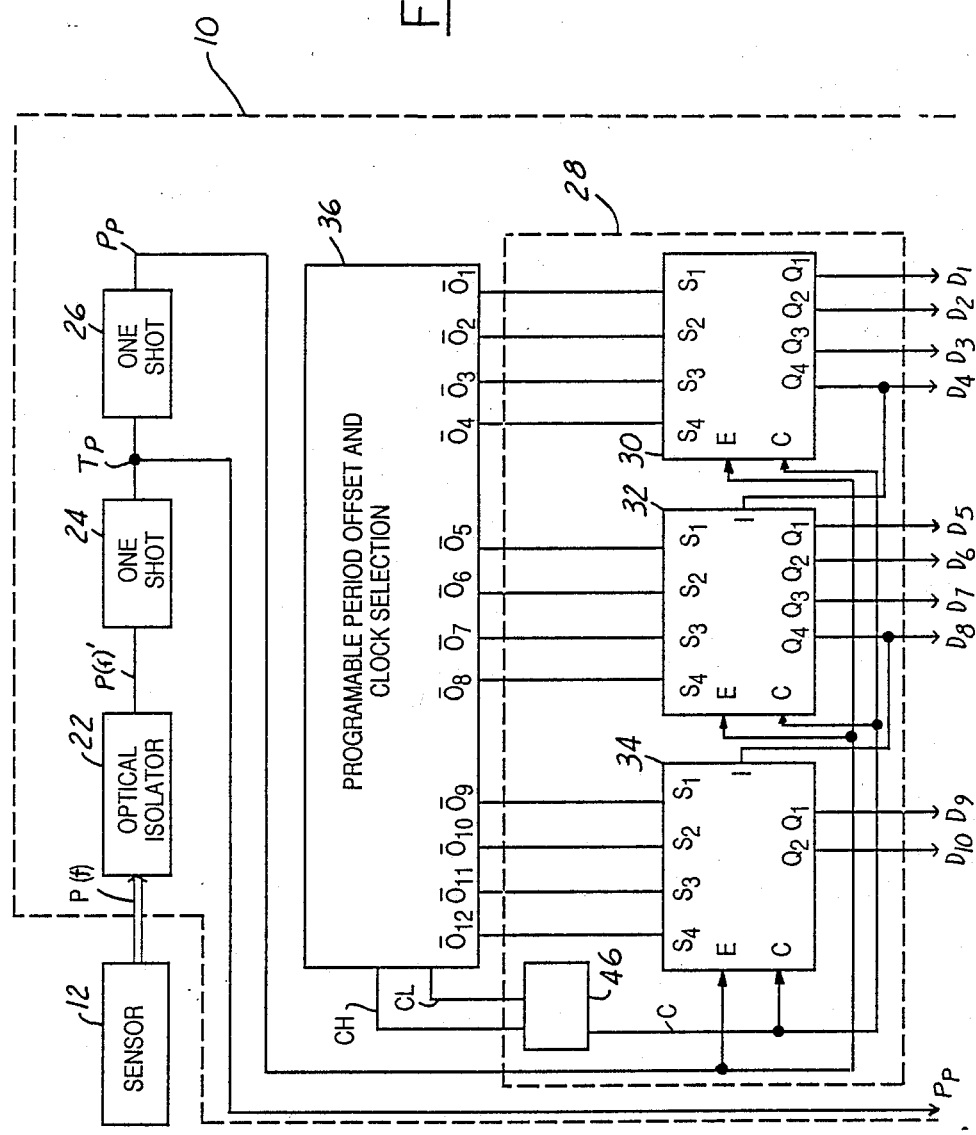
FIGS. 1A and 1B show an electrical schematic of an embodiment in which the invention is used to advantage.
Figure 1B:
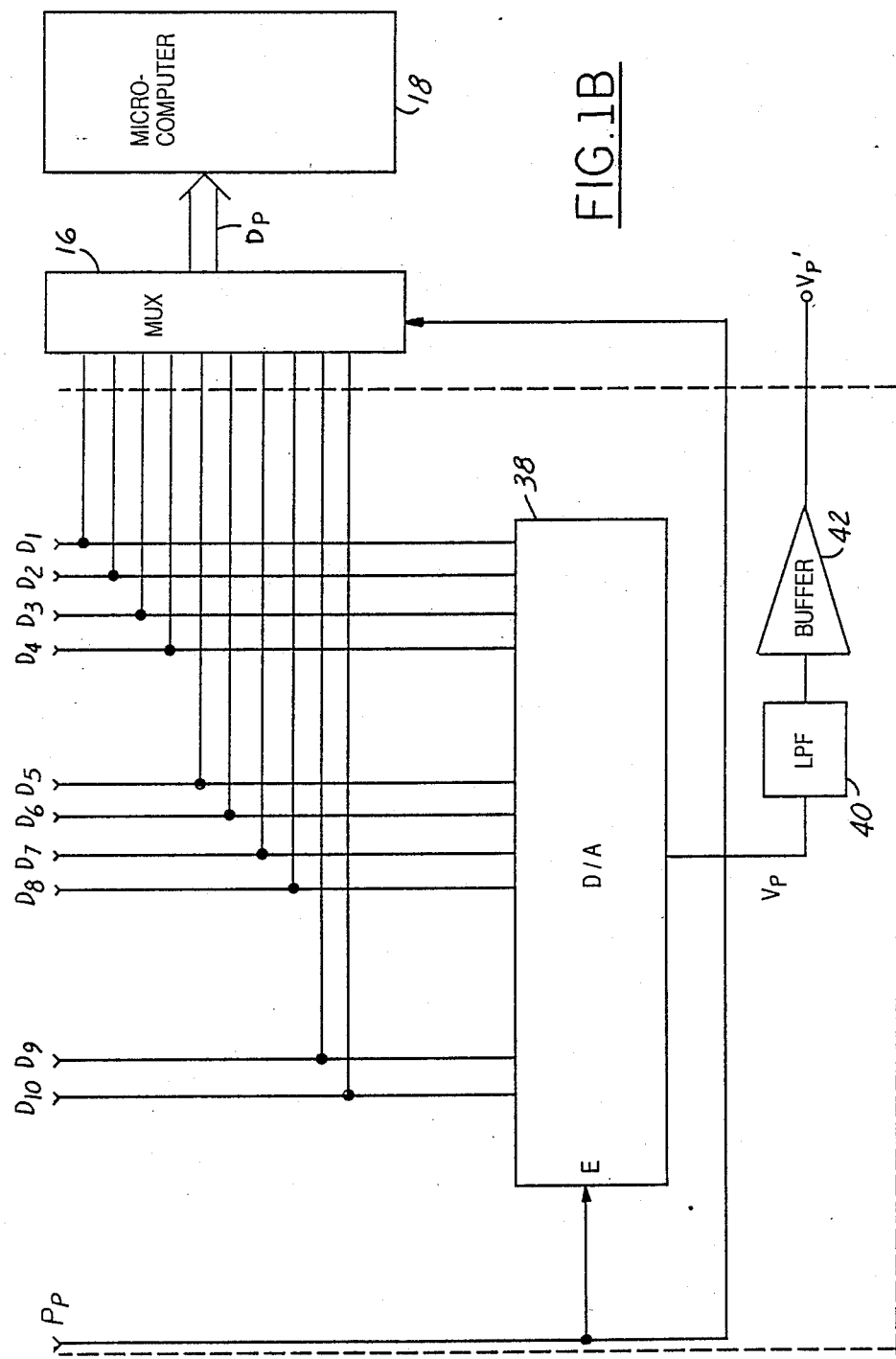

Referring first to FIGS. 1A and 1B, period to amplitude conversion circuit 10 is shown in this particular example providing voltage signal $V_p$ proportional to the time period, and accordingly, frequency of signal P(f) from conventional manifold pressure sensor 12. Conversion circuit 10 is also shown in this example providing a digital word $D_p$ ($D_1$–$D_{10}$) proportional to the period of signal P(f) via multiplexer 16. Both $D_p$ and $V_p$ are suitable as inputs to either measuring circuits in diagnostic applications, or as inputs to a microcomputer such as microcomputer 18 for onboard engine control applications. In a typical engine control application, microcomputer 18 computes the mass airflow inducted into an engine (not shown) in response to $D_f$ and a signal related to engine speed (not shown) utilizing a conventional speed density algorithm. After calculating mass airflow, microcomputer 18 calculates a desired fuel charge signal (not shown) for maintaining engine operation at a desired air/fuel ratio.

Conversion circuit 10 is shown including optical isolator 22, available from Hewlett Packard as part no. 6N139, coupled to sensor 12 for providing signal P(f)' directly related to, and electrically isolated from, signal P(f). One-shot circuit 24, available from RCA as part no. 74HC221, provides transfer pulse $T_p$ each rising edge of signal P(f). Essentially identical one-shot circuit 26 provides preset pulse Pp following transfer pulse $T_p$.

Counter 28 is shown in this example as a 12 bit counter formed by appropriately interconnecting three 4 bit counters 30, 32, and 34, each available from RCA as part no. 74HCT193. Each of the counters (30, 32, and 34) is shown having four outputs (Q1, Q2, Q3, and Q4), four preset inputs (S1, S2, S3, S4), a preset enable input (E) coupled to preset pulse Pp, and a clock input coupled to clock signal C. Accordingly, counter 28 has 12 preset inputs for accepting a 112 bit preset upon actuation by preset pulse $P_p$. Clock signal C is shown generated by conventional programmable oscillator 46 in response to high clock signal CH and low clock signal CL from programmer 36. Programmer 36 also provides the 12 bit preset input to counter 28 as described in greater detail herein below.

For the particular example shown herein, the ten least significant bits of counter 28 (D1, D2, D3, D4, D5, D6, D7, D8, D9, and D10) are shown coupled to 10 bit digital to analog (D/A) converter 38, available from Datel as part no. DAC-UP10B. These ten least significant bits are transferred to D/A converter 38 by transfer pulse $T_p$. D/A converter 38 provide signal $V_p$ having an amplitude directly related to the time period, and accordingly frequency, of signal P(f). For the example shown herein, signal $V_p$ is filtered in conventional low pass filter 40 and buffered via operational amplifier circuitry 42 for noise filtering and electrical interface wit external circuitry.

In general terms, counter 28 is characterized herein as a N+M bit counter receiving a N+M bit preset and providing a N bit output to a N bit D/A converter. For the particular example described herein, N is shown as 10 bits and M is shown as 2 bits.

Figures 2, 4:
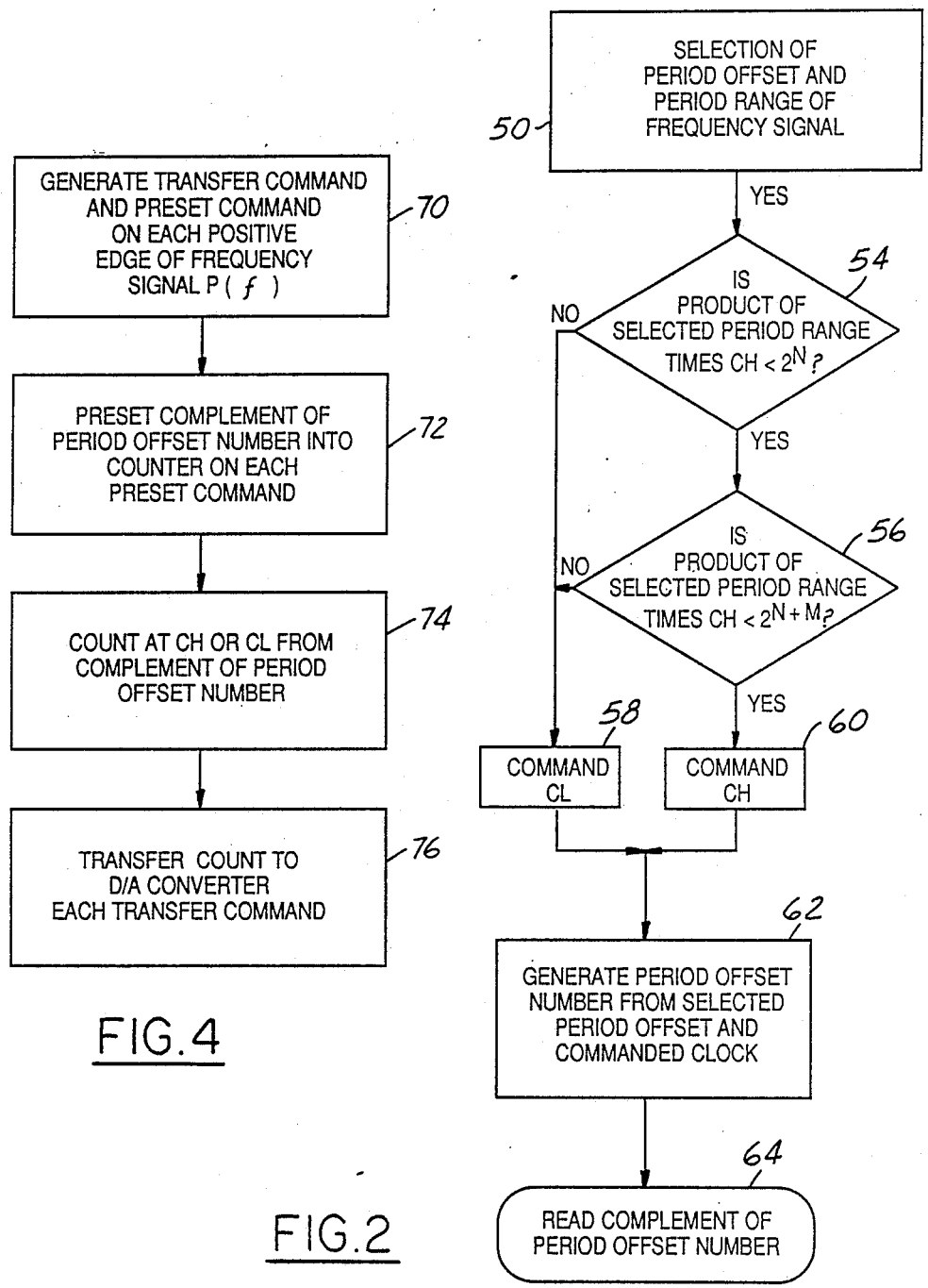
FIG. 2 shows various steps performed by a portion of the embodiment shown in FIGS. 1A and 1B.
FIG. 4 is an alternate embodiment of a portion of the embodiment shown in FIGS. 1A and 1B.

Programmer 36 is now described with reference to process steps 50, 54, 56, 58, 60, 62, and 64 shown in FIG. 2. It is noted that programmer 36 and the associated process steps may be performed by a microcomputer, such as microcomputer 18, or by discrete logic components such as integrated circuits or similar switching devices. For reasons described hereinafter, the period offset, which is the minimum period of frequency signal P(f), and period range of signal P(f) are first selected as illustrated instep 50. These values, which are the reciprocal of the minimum frequency and frequency range of signal P(f), are known from the characteristics of sensor12. For example, in applications wherein a capacitive manifold pressure sensor is represented by sensor 12, the time period of the frequency signal varies from 6.16 ms to 11.18 ms (89.42 Hz–162.25 Hz). Thus, in this illustrative example, the desired period range of signal P(f) would be 5.02 ms and the desired period offset 6.16 ms.

The product of the selected period range times a high clock frequency CH is then compared to $2^N$ in process step 54. If this product is greater than $2^N$, low clock signal CL is commanded in step 58 to prevent overflow of the first N bits of counter 28. In the event the product is less than $2^N$, the product of the selected period offset times a high clock signal CH is compared to $2^{N+M}$ in step 56. If this product is greater than $2^{N+M}$, the low clock signal CL is commanded to prevent overflow of the N+M bits of counter 28. When this product is less than $2^{N+M}$, high clock signal CH is commanded as shown in step 60.

A period offset number is then generated in step 62 which is a binary representation of the product of the selected period offset times the commanded clock signal. The complement of the period offset number is then read out of programmer 36, as represented by step 64, on output lines $O_1, O_2, O_3, O_4, O_5, O_6, O_7, O_8, O_9, O_{10}, O_{11}$, and $O_{12}$ (FIGS. 1A and 1B) were $O_1$ represents the less significant bit (LSB) and $O_{12}$ represents the most significant bit (MSB).

Referring back to FIGS. 1A and 1B, and also referring to the associated electrical waveforms shown in FIGS. 3A-3E, the operation of conversion circuit 10 is now described. For illustrative purposes, three different time periods of frequency signal P(f) are shown in FIG. 3A. During the $t_0$–$t_2$ time interval, frequency signal P(f) is sown at the maximum of the selected period range. During the $t_2$–$t_4$ time interval, frequency signal P(f) is shown having an intermediate period which is less than the maximum period. During the $t_4$–$t_5$ time interval, frequency signal P(f) is shown having the minimum period of the period range. Stated another way, signal P(f) is shown having shifted from its minimum frequency ($t_0$–$t_2$ time period), to an intermediate frequency ($t_2$–$t_4$ time period), to its maximum frequency (time period $t_4$–$t_5$) Signal $V_p$ from D/A converter 38 is shown in FIG. 3A as a voltage having an amplitude which directly tracks the frequency and time period of signal P(f).

After generation of the period offset number, as described previously herein with particular reference to FIG. 2, the complement of the N+M bit period offset number is preset into counter 28 by signal $P_p$. More specifically, upon presentation of pulse $P_p$ to the enable inputs of counters 30, 32, and 34, the four LSB's ($O_1$–$O_4$) of the period offset number are preset via respective preset inputs S1–S4 of counter 30, the second four bits (0 are preset via respective preset inputs $S_1$–$S_4$ of counter 32, and the four MSB are preset via respective preset inputs $S_1S_4$ of counter 34.

Referring first to the maximum time period of signal P(f) shown in the $t_0$–$t_2$ time interval, counter 28 counts up from the complement of the period offset number at clock frequency C. After counter 28 reaches its maximum count of all ones in each of its N+M bits, the next clock pulse rolls counter 28 over to all zeros as shown at time $t_1$ of FIG. 3D. Thus, at time t1 counter 28 has counted over a time period equal to the selected period offset. Between time $t_1$ and the end of the first period of frequency P(f), shown in FIG. 2 at time $t_2$, counter 28 counts from all zeros at clock frequency C to a count correlated with the actual time period of frequency signal P(f). At the end of time $t_2$, the count in counter 28 is directly related to the first period of frequency signal P(f) shown between 0 and $t_2$. This count is loaded into D/A converter 38 with transfer pulse $T_p$ following time $t_2$. Thus, after time $t_2$, voltage signal $V_p$ from D/A converter 38 is directly related to the period of frequency signal P(f) between $t_1$ and $t_2$.

It is noted that in the above example wherein frequency signal P(f) is at its maximum period of the selected period range, the entire N bits of counter 28 is utilized to generate a binary representation of the time period, and accordingly frequency, of frequency signal P(f). These N bits are transferred to N bit D/A converter 38 on transfer pulse $T_p$. Thus, the resolution has been optimized for converting the time period of frequency signal P(f) into a voltage signal $V_p$. Further, the clock frequency has been optimized for selected period range as explained previously herein with particular reference to FIG. 2.

Reference is know made to the intermediate period of frequency signal (f) shown in the $t_2$-$t_4$ time interval. As described above with reference to the $t_0$-$t_1$ time interval, the complement of the period offset is preset into counter 28 on the first preset pulse $P_p$ following time $t_2$. The period offset is determined as previously described herein with reference to FIG. 2 and is the same period offset provided at time $t_0$. Counter 28 again Counts at clock frequency C from the complement of the period offset to zero as shown at time $t_3$ in FIG. 3D. The time elapsed ($t_2$-$t_3$) to count from the preset period offset to zero is equal to the selected period offset. Thereafter, counter 28 counts up at clock frequency C until the next rising edge of frequency signal P(f) at time $t_4$. Thus the count in counter 28 at time $t_4$ is a binary representation of the period of frequency signal P(f) during the $t_2$-$t_4$ time interval. The first N bits of counter 28 is then transferred to D/A converter 38 at the first transfer pulse $T_p$ following $t_4$.

As shown in FIG. 3D, the final count in counter 28 at $t_4$ is less then the final count at $t_2$ because signal P(f) is shown having a lower time period, and accordingly higher frequency, than during the $t_0$-$t_2$ time interval. Similarly, the output of D/A converter 38, which is proportional to the period of signal P(f), is shown decreased at time $t_4$.

During the $t_4t_5$ time interval, signal P(f) is illustrated at near its minimum period within the selected period range. In this example, counter 28 is shown counting from the complement of the period offset number to a final count at time $t_5$. At time $t_5$, the count in counter 28 is near zero which correlates with a minimal period within the selected period range.

It is evident from the three illustrated examples presented with reference to FIGS. 3A-3E, that the dynamic range of counter 28 is centered on the selected period range of signal P(f). The number of data bits used ($2^N$) for converting period to amplitude has therefore been minimized. The embodiment shown herein utilizes $2^N$ bits whereas prior approaches required $2^{N+M}$ bits. Accordingly, a greater signal to noise ratio is achieved than heretofore possible in translating the period of signal P(f) to an amplitude such as voltage signal $V_p$. Further, with respect to prior approaches, the number of data lines to microcomputer 18 has been minimized and, therefore, any subsequent processing performed by microcomputer 18 has been minimized.

For the particular example presented herein, the period offset is shown being greater than the period range. In general, the period offset may be any number up to $2^{M+N}$, and the period range may be any number up to $2^N$. Thus, the period offset may be greater than the period range by a factor of $2^M$. In the embodiment illustrated in FIGS. 1A and 1B, M was selected as 2 although other numbers may be used for applications requiring different period ranges and period offsets.

It is further noted with reference to FIGS. 1A and 1B, that a digital output $D_p$ ($D_1$-$D_{10}$) directly related to the period of frequency signal P(f) is also provided from counter 28. For the particular example shown in FIGS. 1A and 1B, digital output $D_p$ is coupled to the data bus of microcomputer 18 through conventional multiplexer 16. Microcomputer 18 accepts the digital output from counter 28 for performing processing on signal P(f) such as, for example, conversion of manifold pressure into a measurement of mass airflow as previously described herein. A measurement of mass airflow is utilized in conventional automobile applications to regulate the air/fuel mixture inducted into an internal combustion engine.

It is also noted that conversion circuitry 10 may be incorporated directly in a microcomputer such as microcomputer 18. In such an application, the process steps performed by microcomputer 18 are shown in FIG. 4. More specifically, after generating the period offset number and clock frequency as previously described herein with reference to FIG. 2, both a transfer and preset command are generated with each rising edge of frequency signal P(f) as shown in process step 70. In response to the preset command, the complement of the period offset is preset into a counter or equivalent storage such as a RAM within microcomputer 18 as illustrated by step 72. During process step 74, the counter is clocked at either clock frequency CH or CL dependent upon the decision output from process steps 54, 56, 58, and 60 previously described with reference to FIG. 2. In process step 76, the count is then loaded into a D/A converter upon the transfer command.

This concludes the description of the preferred embodiment. The reading of it by those skilled in the art will being to mind many alterations and modifications without departing from the spirit and scope of the invention. For example, conversion circuit 10 may comprise discrete components as shown in FIGS. 1A and 1B or may be incorporated within a microcomputer performing the process steps illustrated in FIG. 4. Accordingly, it is intended that the scope of the invention be limited only by the following claims.

I claim:

1. An apparatus for determining a period of a frequency signal having a period greater than a minimum period, comprising:
    a transition detector for detecting edge transitions of said frequency signal;
    a clock generator providing a clock signal;
    offset means for providing an offset signal related to both said minimum period and said clock signal; and
    counter means coupled to said transition detector and said clock generator and said offset means for counting from said offset signal at said clock signal to provide a count related to the period of said frequency signal in response to said edge transitions.

2. The apparatus recited in claim 1 further comprising a digital to analog converter coupled to said counter for providing a voltage output related to the period of said frequency signal.

3. The apparatus recited in claim 1 further comprising means for converting said count into an output signal having an amplitude related to the period of said frequency signal.

4. An apparatus for determining a period of a frequency signal having a period both greater than a minimum period and within a period range, said apparatus comprising:
- an edge detector for detecting edge transitions of said frequency signal in a predetermined direction;
- clock selection means for providing a clock signal;
- offset means for providing an offset signal by multiplying said minimum period by said clock signal; and
- counter means coupled to said edge detector and said clock selection means and being preset with a complement of said offset signal from said offset means for counting from said complement of said offset signal at said clock signal to provide a count related to the period of said frequency signal in response to said edge transitions.

5. The apparatus recited in claim 4 further comprising a digital to analog converter coupled to said counter for providing a voltage output related to the period of said frequency signal.

6. The apparatus recited in claim 4 further comprising means for converting said count into an output signal having an amplitude related to the frequency of said frequency signal.

7. The apparatus recited in claim 4 wherein said clock selection means provides said clock signal by comparing said period range to a predetermined value.

8. The apparatus recited in claim 4 wherein said clock selection means provides said clock signal by comparing said period range to a predetermined value and also by comparing said minimum period to another predetermined value.

9. An apparatus for determining a period of a frequency signal having a period greater than a minimum period and within a period range, said apparatus comprising:
- detection means for detecting edge transitions of said frequency signal in a predetermined direction;
- counter means comprising a binary counter having N+M bits and clocked at a clock frequency;
- clock selection means for providing said clock frequency such that said clock frequency times said predetermined range is less than $2^N$ and said clock frequency times said minimum period is less than $2^{N+M}$;
- offset means for providing an offset number related to said clock frequency times said minimum period and for providing a complement of said offset number having N+M bits; and
- said counter means being preset with said complement of said offset number in response to an edge transition for counting from said complement of said offset number to zero and from zero to a final count at a subsequent edge transition, said final count being related to the period of said frequency signal and being contained within N bits.

10. The apparatus recited in claim 9 further comprising digital to analog converter coupled to said N bits of said binary counter for converting said final count into a voltage signal having an amplitude related to the period of said frequency signal.

11. The apparatus recited in claim 9 further comprising a pressure sensor for providing said frequency signal.

12. A method for determining a period of a frequency signal having a period greater than a minimum period, comprising the steps of:
- detecting edge transitions of said frequency signal;
- providing a clock signal;
- providing an offset signal by multiplying said minimum period with said clock signal; and
- counting from said offset signal at said clock signal to provide a count related to the period of said frequency signal in response to said edge transitions.

13. The method recited in claim 12 further comprising the step of converting said count to a voltage signal.

14. A method for determining a period of a frequency signal having a period greater than a minimum period and within a period range, said method comprising the steps of:
- detecting edge transitions of said frequency signal in a predetermined direction;
- generating a clock frequency such that said clock frequency times said predetermined range is less than $2^N$ and said clock frequency times said minimum period is less than $2^{N+M}$;
- providing a binary offset number having N+M bits by multiplying said clock frequency times said minimum period;
- presetting a counter having N+M bits with a complement of said offset number in response to said edge transitions; and
- counting at said clock frequency from said complement of said offset number to zero and from zero to a final count at a subsequent edge transition, said final count being related to the period of said frequency signal and being contained within N bits.

15. The method recited in claim 14 further comprising the step of converting said final count to a voltage signal having an amplitude related to the period of said frequency signal.

* * * * *